United States Patent [19]

Goss et al.

[11] Patent Number: 5,621,617

[45] Date of Patent: Apr. 15, 1997

[54] CIRCUIT CARD MOUNTING SYSTEM HAVING A CYLINDRICAL HOUSING AND CIRCULAR CARD LOCKS

[75] Inventors: Steven R. Goss; Owen H. Taggart, both of Tucson, Ariz.

[73] Assignee: Hughes Missile Systems Company, Los Angeles, Calif.

[21] Appl. No.: 475,253

[22] Filed: Jun. 7, 1995

[51] Int. Cl.$^6$ ........................................... H05K 7/20
[52] U.S. Cl. .................. 361/721; 361/707; 361/735; 403/409.1; 439/487
[58] Field of Search .................. 24/524–528; 403/374, 403/409.1; 254/104; 174/16.3; 165/80.3, 185; 211/41; 257/685, 686, 713, 723, 724; 439/65, 68, 485, 487, 620; 361/704, 707, 709, 710, 716–721, 729, 730, 732, 733, 735, 784, 789, 790, 744

[56] References Cited

U.S. PATENT DOCUMENTS

| | | | |
|---|---|---|---|
| 4,400,858 | 8/1983 | Goiffon | 24/255 BS |
| 4,514,784 | 4/1985 | Williams | 361/386 |
| 4,542,442 | 9/1985 | Drexler | 361/413 |
| 4,858,068 | 8/1989 | Bitller | 361/380 |
| 4,956,746 | 9/1990 | Gates, Jr. | 361/385 |
| 5,105,337 | 4/1992 | Bitller | 361/386 |
| 5,251,099 | 10/1993 | Goss | 361/721 |

*Primary Examiner*—Gerald P. Tolin
*Attorney, Agent, or Firm*—Charles D. Brown; Wanda K. Denson-Low

[57] ABSTRACT

Apparatus for housing circuit cards that comprises a cylindrical housing having an internal wall having a single diameter. First and second cylindrical heat sinks are provided that each comprise a sloped outer surface. The heat sinks are disposed such that the sloped outer surfaces face each other. First and second circuit cards are secured to distal edges of respective heat sinks, or pairs of circuit cards are secured to both edges of respective heat sinks. Each circuit card comprises at least one internal interface connector that is designed to mate with an internal interface connector of an adjacent circuit card. A cylindrical card lock is provided that has an outer surface that is designed to contact the internal wall of the housing and an inner surface that has a V-shaped cross section having oppositely sloped surfaces. The respective sloped surfaces of the card lock are designed to mate with the sloped outer surfaces of the respective heat sinks. Apparatus is provided for drawing the heat sinks together to cause the sloped surfaces thereof to press against the respective mating sloped surfaces of the card lock and expand the card lock and secure the card lock, heat sinks, and circuit cards in the housing. First and second sealing plates are optionally provided that seal opposite ends of the housing and provide a hermetic enclosure. External interface connectors are provided on the sealing plates to interface to external electronics and couple signals and power to and from the circuit cards.

12 Claims, 2 Drawing Sheets

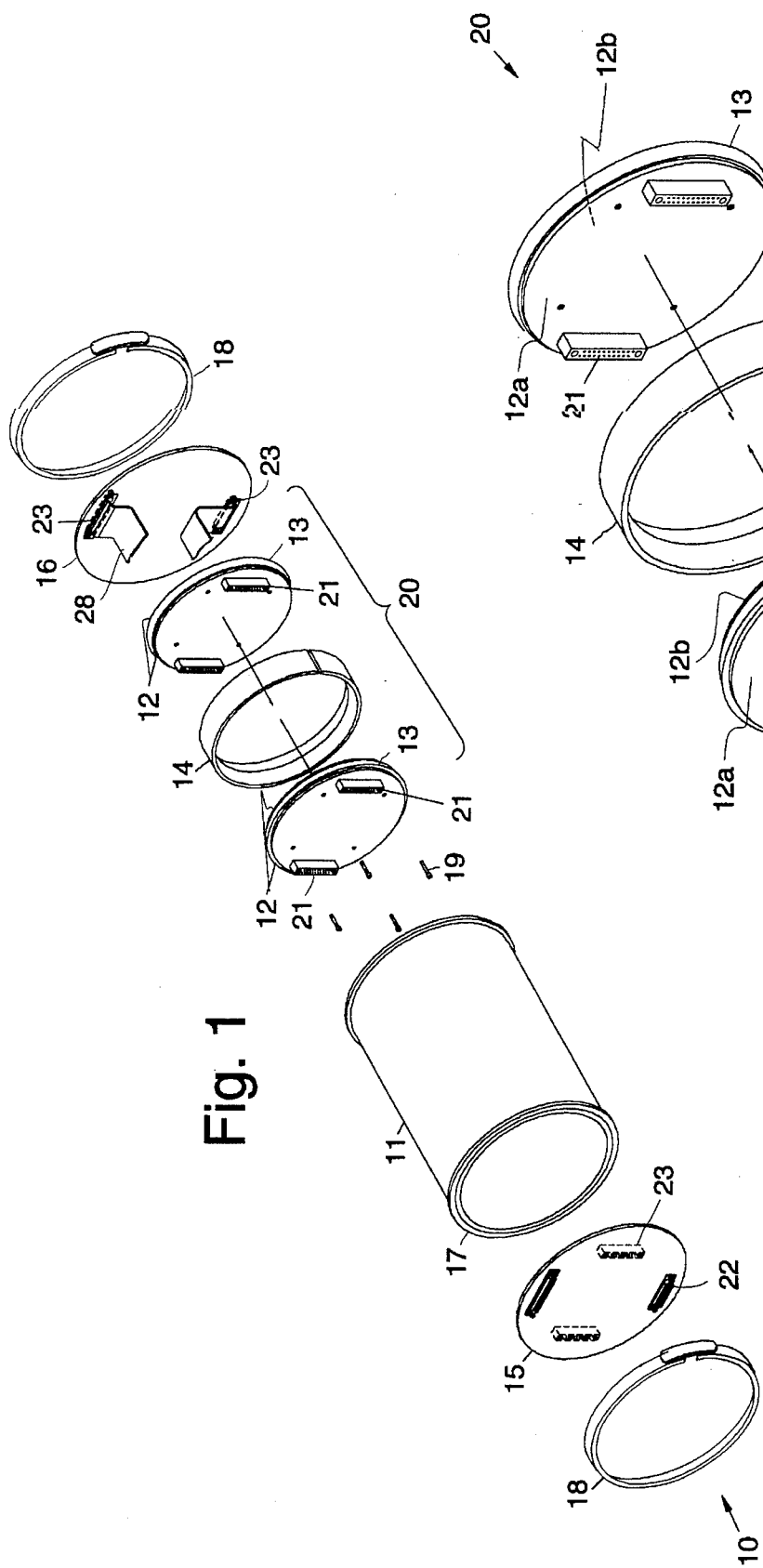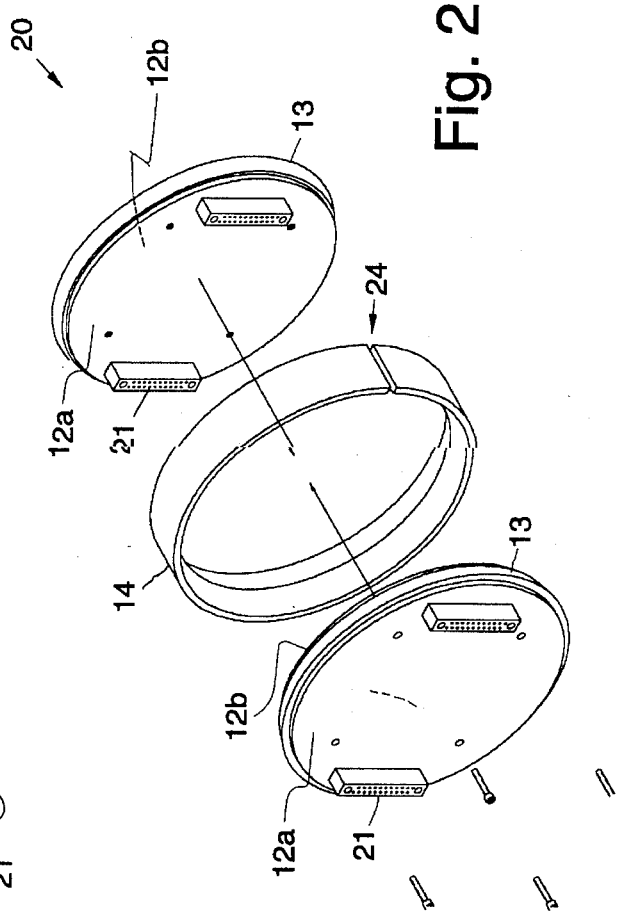

CIRCUIT CARD MOUNTING SYSTEM HAVING A CYLINDRICAL HOUSING AND CIRCULAR CARD LOCKS

BACKGROUND

The present invention relates to circuit cards, and more particularly, to a circuit card mounting system for housing circuit cards, and circular cards in particular.

A common way to mount cylindrical circuit cards in electronic housings is by using screws and standoffs. This system of mounting circuit cards requires areas on the circuit cards to be kept clear of components and circuitry, which reduces the usable area of the board. Multiple stacks of circuit cards using standoffs require close tolerance of screw holes, spacers, circuit card, and heat sink thicknesses, otherwise the ending tolerance stack up prevents a proper fit and alignment within the housing. The use of screws and standoffs also present added cost in fabrication because drilling and tapping operations are necessary. The elimination of torquing and alignment is virtually eliminated by the present invention.

If thermal requirements indicate that a thermal path to the housing is needed, sometimes elaborate (if not crude) devices are designed to accomplish a marginal amount of thermal heat transfer. The use of lightweight "touch" type connectors (woe strips, fuzz buttons, etc.) are difficult to use in standoff-type designs due to their inherent inability to provide for variable positioning. Distortion of circuit cards by use of screw fasteners may cause gaps between the contacts creating board malfunctions.

The present invention provides for an improved circuit card mounting system that may be used in a system such as is described in U.S. Pat. No. 5,251,099 entitled "High Density Electronics Package Having Stacked Circuit Boards", assigned to the assignee of the present invention, the contents of which are incorporated herein by reference. This patent discloses a high-density electronics package that houses a plurality of circuit cards, heat sinks and circuit interconnections in a single housing. The electronics package uses conical shaped interfaces for locating and locking components, which greatly enhances the serviceability, thermal management and strength of the electronics package. Assembly is accomplished by using a selected conical angle on a first heat sink that mates with a matching conical surface on the housing. A second heat sink has a conical angle (located in the opposite direction of the conical angle of the first heat sink) that mates with an identical angle on an expandable wedge ring used for positioning purposes. A small wedge shaped block is used to spread the second conical shaped ring and induce a compression load on all internal assemblies. This mounting feature provides automatic heat sink to heat sink axial alignment regardless of tolerances, therefore simplifying assembly and providing intimate contact between the heat sinks and the housing, and thus creating a thermal path from the circuit cards to the housing.

It is therefore an objective of the present invention to provide a circuit card mounting system for housing circuit cards.

SUMMARY OF THE INVENTION

In order to meet the above and other objectives, the present invention provides for a circuit card mounting system for housing a plurality of circuit cards that includes a novel circuit card lock arrangement for this purpose. The present circuit card mounting system comprises a cylindrical housing, a pair of heat sinks, at least two circuit cards that are bonded or otherwise secured to distal surfaces or edges of the respective heat sinks, and the circuit card lock, all of which are assembled and secured within the housing.

The two heat sinks have their outer edges sloped at an angle, and adjacent edges of the heat sinks have a smaller diameter than distal edges. The circular card lock has two angled or sloped surfaces that match the respective sloped edges of the heat sinks. The circular card lock is used to mount the assembled pairs of circular circuit cards in the housing. The two heat sinks with the circuit cards secured thereto are drawn together so that their sloped edges contact the mating sloped edges of the card lock using a plurality of screws or other devices to form a circuit card module. When the heat sinks are drawn together, their relative motion causes the circular card lock to expand and therefore its outer surface presses against the inner wall of the housing and secures the assembled circuit cards and heat sinks in the housing. While circuit cards of any configuration may be used, circular circuit cards are preferred and maximize the transfer of heat to the heat sinks and housing.

First and second sealing plates that include O-ring seals are optionally provided that may be used to seal opposite ends of the housing to provide for a hermetic enclosure. First and second V-band clamps, for example, are provided to secure the sealing plates to the housing.

Each circuit card includes at least one internal interface connector that mates with an internal interface of an adjacent circuit card. The first and second sealing plates include at least one external interface connector that is used to interface to external electronics to permit coupling of signals and power to and from the circuit cards contained within the housing. One of the sealing plates include at least one internal interface connector that mates to the internal interface connector of an adjacent circular circuit card. The other of the sealing plates includes a flexible cable that interconnects its external interface connector to the internal interface connector of the adjacent circuit card. The use of the flexible cable permits electrical connection to varying numbers of circuit card modules and eliminates the requirement for precise sizing of components to insure connection to external equipment.

The present circuit card mounting system may be used with any application requiring circular or other shaped circuit cards that must be packaged in a versatile, low cost, thermally efficient and structurally sound unit. The circuit card mounting system also provides a means for standardizing circular circuit card packaging.

In a preferred embodiment, up to four cards are attached to two heat sinks and a circular card lock to form one module. Any number of modules may then be placed anywhere within a circular housing (tube) having a single internal diameter, wherein the length of the housing is the only determining factor. A module may be placed at any location in the housing. The nature of the circular card locks makes the present invention especially valuable in the reduction of design and fabrication costs since it virtually overcomes problems associated with circular cards and housings. The ability to package many circuit cards and provide thermal transfer to the outside of a cylindrical housing makes the present invention an excellent candidate for uses that require hermetic or environmental sealing, since external methods of cooling can be employed during testing and end use.

The heart of the invention is the use of a straight circular (tubular) housing having a single internal diameter in which a single circular card lock that has an outside diameter that makes intimate contact with the inside diameter of the housing. On the inside of the circular card lock are two conical angles wherein one starts at one edge and the other starts on the other edge and steadily decrease in diameter until they reach the middle of the card lock. There is a split in the card lock that allows for expansion and contraction. Two heat sinks having conically shaped edges are placed on each side of the circular card lock with their small diameters facing one another. When the two heat sinks are drawn together with screws or other devices, the card lock is activated causing expansion and tightening against the inside wall of the housing. This provides a structural attachment without the use of machined card guides. Intimate contact between the mating surfaces of the heat sinks and card lock, and the expansion of the card lock against the inside diameter of the housing provides a path for heat transfer.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1 is a exploded view of a circuit card mounting system in accordance with the principles of the present invention;

FIG. 2 is an enlarged exploded view showing two pair of circuit cards secured to heat sinks and the card lock that is used to secure them.

DETAILED DESCRIPTION

Figure 3:
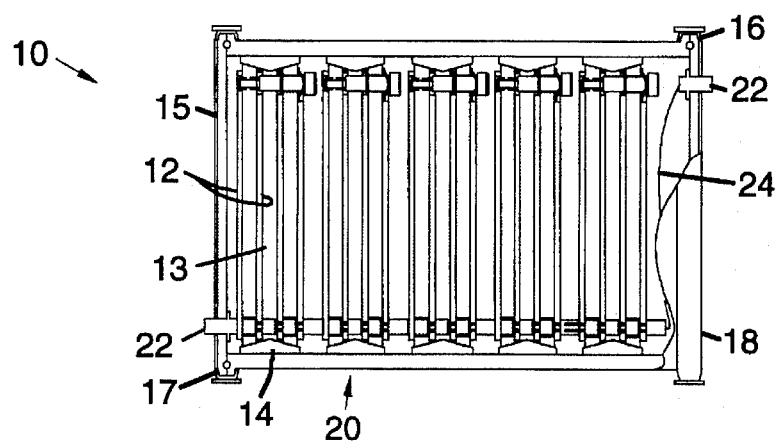
FIG. 3 is a cross sectional view of a fully assembled of the circuit card mounting system of FIG. 1.

Referring to the drawing figures, FIG. 1 is a exploded view of a circuit card mounting system 10 in accordance with the principles of the present invention. The circuit card mounting system 10 houses circular circuit cards 12 and includes a circuit card lock 14 for this purpose. The circuit card mounting system 10 comprises a housing 11, and a plurality of pairs of circular circuit cards 12 disposed in the housing 11, wherein each pair of circular circuit cards 12 sandwich a conically shaped heat sink 13. While circuit cards 12 of any configuration may be used in the present invention, circular circuit cards 12 are preferred because they maximize the space available for electronic components.

Each pair of circuit cards 12 are bonded or otherwise secured to opposite sides of the heat sinks 13. The heat sinks 13 having the circuit cards 12 bonded thereto are caused to be drawn together by means of a plurality of screws 19. This forms a circuit card module 20. The circular card lock 14 is used to mount the assembled pairs of circuit cards 12 (module 20) in the housing 11 as will be discussed with reference to FIGS. 3–6. The circular housing 11 has a single internal diameter and the circular card lock 14 has an outside diameter that makes intimate contact with the inside diameter of the housing 11. First and second optional sealing plates 15, 16 that include O-ring seals 17 are provided that seal opposite ends of the housing 11 that are used to provide for a hermetically sealed housing 11. First and second V-band clamps 18 are provided that secure the sealing plates 15, 16 to the housing 11.

Each pair of circuit cards 12 includes at least one internal interface connector 21 that couples to an internal interface connector 21 of an adjacent circuit card 12. The first and second sealing plates 15, 16 include at least one external interface connector 22 that is used to interface to external electronics to permit coupling of signals and power to and from the circuit cards 12 contained within the housing 11. One of the sealing plates 15 includes at least one internal interface connector 23 that mates to the internal interface connector 21 of an adjacent circuit card 12. The other sealing plate 16 includes a flexible cable 28 that connects between an external interface connector 23 and the internal interface connector 21 of the adjacent circuit card 12. It is to be understood that various arrangements for the connectors 21, 22, 23 may be employed to couple signals into and out of the housing 11 and between the circuit cards 12, which will be readily apparent to those skilled in the art.

Referring to FIG. 2, it is an enlarged exploded view showing two pair of circuit cards 12 secured to heat sinks 13 and the card lock 14 that is used to secure them. The inside diameter of the circular card lock 14 has two conical surfaces or angles 25 wherein one starts at one edge and the other starts at the other edge and steadily decrease in diameter until they reach the middle of the card lock 14. This results in a card lock 14 having a V-shaped cross section at its inner diameter. There is a split 24 in card lock 14 that allows for expansion and contraction.

Two conically shaped heat sinks 13a, 13b are disposed on each side of the circular card lock 14 with their small diameters facing one another. When the two heat sinks 13a, 13b are drawn together with screws 19 or other devices so that adjacent sloped surfaces contact each other, the circular card lock 14 is activated causing expansion and tightening against the inside diameter of the circular housing 11. This provides a structural attachment of the modules 20 without the use of machined card guides. The circular (tubular) housing 11 has a single internal diameter and the circular card lock 14 has an outside diameter that makes intimate contact with the inside diameter of the housing 11. Intimate contact between the conical surfaces 25 of the heat sinks 13a, 13b and the expansion of the circular card lock 14 against the inside diameter of the housing 11 provide a thermal transfer path for removing heat.

In a preferred embodiment, up to four cards 12 may be attached to the card lock 14 to form a module 20. Any number of modules 20 may then be placed anywhere within the circular housing 11. The housing 11 has a single internal diameter and the length of the housing 11 is the only determining factor as to how many modules 20 may be housed. The module 20 may be disposed within any portion of the housing 11. It is also to be understood that a module 20 may comprise as few as two circuit cards 12 secured to distal surfaces of the heat sinks 13a, 13b. In this case, pins of the internal connectors 21 are made long enough to insert into receptacles of the internal connectors 21 of the adjacent circuit card 12.

Figure 4:
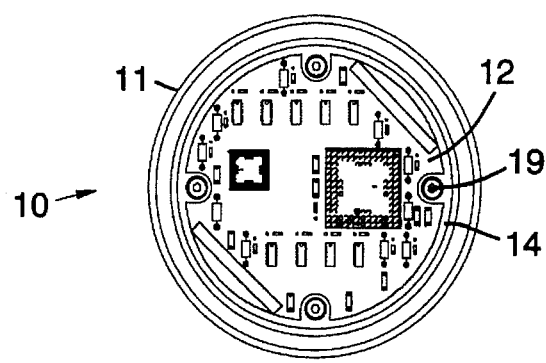
FIG. 4 is an end view of the circuit card mounting system of FIG. 3 with the sealing plate removed.

Referring to FIG. 3, it shows a cross sectional side view of a fully assembled circuit card mounting system 10 shown in FIG. 1 that houses five modules 20. FIG. 4 is an end view of the circuit card mounting system 10 of FIG. 3 with the first sealing plate 15 removed. The five modules 20 are secured internal to the housing 11 using the circular card locks 14. The first and second sealing plates 15, 16 are secured to the opposite ends of the housing 11 by means of the V-band clamps 18 that seal the housing 11 using the O-ring seals 17. The end view of the system 10 shows a typical circuit card 12 and shows the screws 19 that are used to draw the heat sinks 13a, 13b together and expand the card lock 14 to secure the module 20 in the housing 11. Additional details are shown and described with reference to FIGS. 5 and 6.

Figure 5:
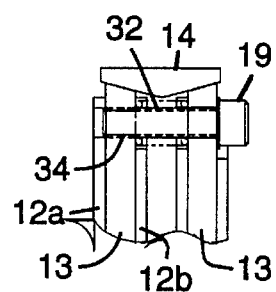
FIGS. 5 and 6 are enlarged views showing two card locks used in the circuit card mounting system of FIG. 3.
Figure 6:
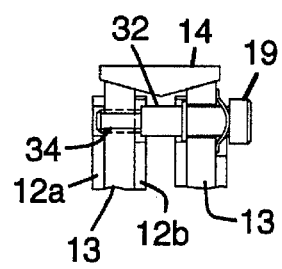

FIGS. 5 and 6 are enlarged views showing two card locks 14 shown in the respective encircled potions of FIG. 3 used in the circuit card mounting system 10 of FIG. 3. With reference to FIG. 5, in one embodiment, securing means 19 for drawing the heat sinks 13a, 13b together is comprised of the screw 19 is used to secure two sets of circuit cards 12a, 12b and heat sinks 13a, 13b together. A spring 32 is disposed around a central portion of the screw 31 between the adjacent heat sinks 13a, 13b that is used to spread apart the heat sinks 13a 13b when loosening the module 20. The screw 19 is inserted into a threaded hole 34 in the other heat sink 13a. With reference to FIG. 6, in another embodiment, a shoulder screw 19 is used to secure the sets of circuit cards 12a, 12b and heat sinks 13a, 13b together. A spring 32 (wave washer) is disposed adjacent the head end of the shoulder screw 19 and is used to provide a preload that takes up tolerances between the shoulder screw 19 and the heat exchanger 13b. A retaining clip 33 is disposed on the opposite side of the heat sink 13b from the shoulder screw 19 to secure the shoulder screw 19 to the heat sink 13. The shoulder screw 19 is inserted into a threaded hole 34 in the other heat sink 13a. Appropriate rotation of the shoulder screw 19 draws together or separates the heat sinks 13a, 13b.

The nature of the circular card locks 14 makes the present invention especially valuable in the reduction of design and fabrication costs since it virtually overcomes problems associated with circular cards 12 and housings 11. The ability to package many circuit cards 12 and provide thermal transfer to the outside of a cylindrical housing 11 makes the present invention an excellent candidate for uses that require hermetic or environmental sealing, since external methods of cooling may be employed during testing and end use.

The circuit card mounting system 10 provides a generic means for assembling circular electronic cards 12 into a low cost, structurally sound, and easily upgradeable package. The present invention provides excellent thermal performance, and structurally provides another solution to mounting circular circuit cards 12. The advantages of the circuit card mounting system 10 over previous systems are that it allows multiple modules 20 to be stacked into the housing 11. Since the inside of the circular housing 11 has no features other than a single diameter and the modules 20 are free-floating until they are tightened, the necessity of maintaining critical dimensions for the interconnection between modules 20 is eliminated. The improvements over conventional systems include cost, modularity, expansion, interchangeability, generic design, and simplicity. All card mounting hardware is accessible and contained within the housing 11. By sealing the two ends of the cylindrical housing 11, it may be environmentally or hermetically sealed without leakage though screw holes or other attachment features. The V-band clamp 18, such as a Marman clamp, for example, is a preferred means for sealing housing 11 because of its simplicity.

The circular housing 11 and circular card locks 14 provide a high degree of thermal transfer capability. Given the current state of art, the present system for mounting multiple circuit cards 12 in a circular housing 11 provides for the best thermal management. If an application requires the use of more than four circuit cards in an assembly, the present circuit card mounting system 10 easily permits expansion.

The use of the present invention results in circular electronics assemblies that provide for thermal management without the use of additional hardware. The present invention provides superior heat transfer capabilities, reduced circuit board flexing (especially advantageous with HDMI technology), and reduced weight.

In a preferred embodiment, a 15 degree conical angle is provided on the heat sinks 13 which mates with matching 15 degree conical angles on the sloped surfaces of the card lock 14. This mounting arrangement provides automatic heat sink to heat sink axial alignment regardless of tolerances, thus simplifying assembly and provides for intimate contact between the heat sink 13, card lock 14 and housing 11 to create a heat transfer path.

To accomplish assembly of the system 10, and with reference to FIG. 5, the first sealing plate 15 is secured to an end of the housing 11 by means of the V-band clamp 18. A first circuit card 12a is bonded to the small conical diameter on a first heat sink 13a and a second circuit card 12b is bonded to the large conical diameter on the first heat sink 13a. This forms a first heat sink assembly. A third circuit card 12a is bonded to the large conical diameter on the second heat sink 13b and a fourth circuit card 12b is bonded to the small conical diameter on the second heat sink 13b. This forms a second heat sink assembly. After the sets of circuit cards 12a, 12b are attached to their respective heat sinks 13a, 13b, the screws 19 are used to partially draw the first and second heat sink assemblies together to form a partially assembled module 20. The card lock is then disposed around the periphery of the partially assembled module 20 and the screws 19 are tightened to start to enlarge the card lock 14. Then, this assembly is placed in the housing 11 (See FIG. 3) and slid so that the internal connector 21 mates with the external connector 22 of the sealing plate 15.

The screws 19 are then fully tightened to draw the heat sinks 13a, 13b together and enlarge the card lock 14 so that it securely contacts the inner wall of the housing, thus locking the module 20 in place. The action of tightening the screws 19 causes pressure that forces the heat sinks 13a, 13b to seat and center in the housing 11 to thereby provide for maximum thermal transfer to the housing 11. Upon tightening, the circular card lock 14 axially locates the heat sink assembly, takes up tolerances in circuit card stack up, provides a positive thermal path to the housing 11, and provides for structural integrity for the module 20.

Additional modules 20 may be assembled and inserted into the housing 11 wherein the internal connector 21 is made to engage the internal connector 21 of the module 20 that was previously inserted into the housing 11, and thereafter its screws 19 are tightened to lock it in the housing. This process repeats until all modules 20 are disposed in the housing 11. Thereafter, the flexible cable 28 is connected to the internal connector 21 of the circuit card 12 of the finally inserted module 20 and the second sealing plate 16 and V-band clamp 18 are affixed to the housing 11 to complete assembly.

Thus there has been described new and improved circuit card mounting system for housing circuit cards. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. Apparatus comprising:
   a cylindrical housing comprising an internal wall having a single diameter;
   first and second cylindrical heat sinks each comprising a sloped outer surface, wherein the heat sinks are disposed such that the sloped outer surfaces face each other;
   first and second circuit cards secured to distal edges of respective heat sinks, wherein each circuit card comprises at least one internal interface connector that mates with an internal interface connector of an adjacent circuit card;
   a cylindrical card lock comprising an outer surface that contacts the internal wall of the housing and comprising an inner surface that has a V-shaped cross section having oppositely sloped surfaces, whose respective sloped surfaces mate with the sloped outer surfaces of the respective heat sinks; and
   means for drawing the heat sinks together to cause the sloped surfaces of the heat sinks to press against the respective mating sloped surfaces of the card lock and expand the card lock and secure the card lock, heat sinks, and circuit cards in the housing.

2. The apparatus of claim 1 further comprising:
   a first sealing plate sealably secured to one end of the housing that comprises at least one external interface connector that mates to the internal interface connector of an adjacent circuit card;
   a second sealing plate sealably secured to the other end of the housing that comprises at least one external interface connector; and
   a flexible cable coupled between the least one external interface connector of the second sealing plate and the internal interface connector of an adjacent circuit card.

3. The apparatus of claim 1 further comprising:
   first and second sealing plates sealably secured to opposite ends of the housing, and wherein one of the sealing plates comprises at least one external interface connector that mates to the internal interface connector of an adjacent circuit card.

4. The apparatus of claim 1 further comprising:
   a first sealing plate sealably secured to one end of the housing, and wherein the first sealing plate comprises at least one external interface connector, and at least one internal interface connector that mates to the internal interface connector of an adjacent circuit card, and a plurality of electrical interconnections coupled between the internal interface connector and the external interface connector for routing signals therebetween;
   a second sealing plate sealably secured to the other end of the housing, and wherein the second sealing plate comprises at least one external interface connector, and at least one internal interface connector, and a plurality of electrical interconnections coupled between the internal interface connector and the external interface connector for routing signals therebetween; and
   a flexible cable coupled between the least one external interface connector of the second sealing plate and the internal interface connector of an adjacent circuit card.

5. The apparatus of claim 1 wherein the circuit cards comprise circular circuit cards.

6. The apparatus of claim 1 wherein the circuit cards are secured to the heat sinks by means of a plurality of screws.

7. The apparatus of claim 2 wherein the first and second sealing plates comprise O-ring seals.

8. The apparatus of claim 2 wherein the first and second sealing plates are secured to the housing by first and second V-band clamps.

9. Apparatus comprising:
   a housing having a single internal diameter;
   a pair of heat sinks each comprising a sloped outer surface, wherein the heat sinks are disposed such that the sloped outer surfaces face each other;
   a plurality of pairs of circuit cards secured to lateral edges of the heat sinks that each include at least one internal interface connector that mates with an internal interface connector of an adjacent pair of circuit cards;
   a circular card lock having an outside diameter that makes intimate contact with the inside diameter of the housing and comprising an inner surface that has a V-shaped cross section having oppositely sloped surfaces, whose respective sloped surfaces mate with the sloped outer surfaces of the respective heat sinks for securing the heat sinks and circuit cards in the housing.

10. The apparatus of claim 9 further comprising:
    first and second sealing plates sealably secured to opposite ends of the housing that comprise at least one external interface connector and at least one internal interface connector that are coupled to the internal interface connectors of adjacent circuit cards, and that comprise a plurality of electrical interconnections coupled between the internal interface connector and the external interface connector for routing signals therebetween.

11. The apparatus of claim 9 wherein the circuit cards comprise circular circuit cards.

12. The apparatus of claim 10 wherein the first and second sealing plates comprise O-ring seals, and the sealing plates are secured by first and second V-band clamps to the housing.

* * * * *